(12) United States Patent
Graf et al.

(10) Patent No.: US 7,838,928 B2  
(45) Date of Patent: Nov. 23, 2010

(54) WORD LINE TO BIT LINE SPACING METHOD AND APPARATUS

(75) Inventors: Werner Graf, Dresden (DE); Lars Heineck, Radebeul (DE); Martin Popp, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/134,740

(22) Filed: Jun. 6, 2008

(65) Prior Publication Data

US 2009/0302380 A1    Dec. 10, 2009

(51) Int. Cl.  
  *H01L 29/792* (2006.01)
(52) U.S. Cl. .................. 257/330; 257/296; 257/326
(58) Field of Classification Search .......... 257/330, 257/296, 326  
See application file for complete search history.

(56) References Cited

U.S. PATENT DOCUMENTS

| | | | |
|---|---|---|---|
| 4,864,374 A * | 9/1989 | Banerjee | 257/68 |
| 6,348,374 B1 | 2/2002 | Athavale et al. | |
| 6,355,520 B1 | 3/2002 | Park et al. | |
| 6,426,253 B1 | 7/2002 | Tews et al. | |
| 6,573,137 B1 | 6/2003 | Divakaruni et al. | |
| 6,593,612 B2 | 7/2003 | Gruening et al. | |
| 7,098,122 B2 * | 8/2006 | Gonzalez | 438/589 |
| 2005/0186740 A1 | 8/2005 | Kim | |
| 2006/0113587 A1 | 6/2006 | Thies et al. | |

OTHER PUBLICATIONS

"DRAM Makers Cut Cost by 30% a Year to 2011", Nikkei Electronics Asia—Jan. 2008, http://techon.nikkeibp.co.jp/article/HONSHI/20071219/144399.

* cited by examiner

*Primary Examiner*—Long Pham

(57) ABSTRACT

In one embodiment, a memory cell includes a bit line arranged in a semiconductor substrate and a bit line contact region arranged adjacent the bit line. A word line is arranged above the bit line contact region in a trench formed in the semiconductor substrate. A generally U-shaped insulating layer is arranged in a bottom region of the trench and separates the bit line and the bit line contact region from the word line.

13 Claims, 10 Drawing Sheets

WORD LINE TO BIT LINE SPACING METHOD AND APPARATUS

BACKGROUND

Volatile and non-volatile memory devices such as Dynamic Random Access Memory (DRAM), embedded-DRAM, Magneto-resistive Random Access Memory (MRAM), FLASH, etc. store bits of information in arrays of memory cells. Each memory cell includes a storage element having the capacity to save one or more bits of information. For example, a DRAM memory cell typically includes an access transistor coupled to a storage capacitor. One bit of information is written to the storage capacitor by activating the word line coupled to the gate of the access transistor. The storage capacitor is then either charged or discharged via the bit line of the cell to store the information bit. The information can be subsequently read by activating the word line and sensing the signal on the bit line.

An MRAM cell stores information in a similar manner, except a magnetic storage element is employed instead of a capacitor. The magnetic storage element typically includes two ferromagnetic plates, each of which can hold a magnetic field. The ferromagnetic plates are separated by a thin insulating layer. One of the plates is a permanent magnet having a particular fixed polarity. The field of the other plate changes to match that of an external field applied by the cell bit line. Read and write operations are controlled by the word line coupled to the gate of the access transistor.

A FLASH memory cell includes a floating-gate transistor for storing one or more bits of information. The floating-gate transistor has two gates instead of one. An upper control gate is formed above an insulated floating gate. The floating gate is interposed between the control gate and the transistor channel. The upper control gate is actuated by the cell word line which controls whether the cell is being written to or read from. One active node (i.e., the source or drain node) of the floating-gate transistor is coupled to the bit line and the other node is coupled to a source line. Because the floating gate is electrically isolated by an insulating layer, any electrons placed on it via the bit line are trapped in the floating gate. This in turn modifies the threshold voltage of the access transistor which determines the state of information stored by the cell.

Some types of memory cells have buried word and bit lines. Memory cell word and bit lines may be buried by forming trenches in a semiconductor substrate and filling the trenches with metal such as Tungsten. Storage elements can be formed on the substrate surface or in the metal layers disposed above the substrate. For example, some types of DRAM cells have a buried word line formed above a buried bit line. The recessed bit line has a contact region coupled to an active region (i.e., the source or drain) of the DRAM access transistor. The other active region of the access transistor is coupled to the overlying storage capacitor.

Buried bit lines and bit line contact regions are vertically separated from overlying buried word lines by a predetermined distance to ensure proper memory cell operation. Buried word and bit line structures may be vertically insulated from one another by forming trenches in a semiconductor substrate above the buried bit line structures. The trenches are then filled with a dielectric material. The oxide is recessed to a particular depth using a timed etch process to form a spacer in the bottom of each trench. Metal is then deposited on top of the spacer to form the word lines. The spacer insulates the underlying bit line and bit line contact regions from the overlying word lines.

However, oxide spacers of this type have a thickness of at least 30 nm or greater and a variation of +/−15 nm when formed in the bottom of a word line trench using a timed etch process. A thinner oxide spacer is difficult to attain because of the poor depth control associated with timed trench-oxide etch processes. Moreover, timed trench-oxide etch processes may yield a large wafer center to wafer edge variation. Thus, thinner trench oxide spacers having less variability are not feasible with conventional approaches. A thinner oxide spacer of about 15 nm with less variation (e.g., +/−5 nm) is desired for reasonable memory device functionality when advanced semiconductor technologies are employed.

SUMMARY

In one embodiment, a memory cell includes a bit line arranged in a semiconductor substrate and a bit line contact region arranged adjacent the bit line. A word line is arranged above the bit line contact region in a trench formed in the semiconductor substrate. A generally U-shaped insulating layer is arranged in a bottom region of the trench and separates the bit line and the bit line contact region from the word line.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
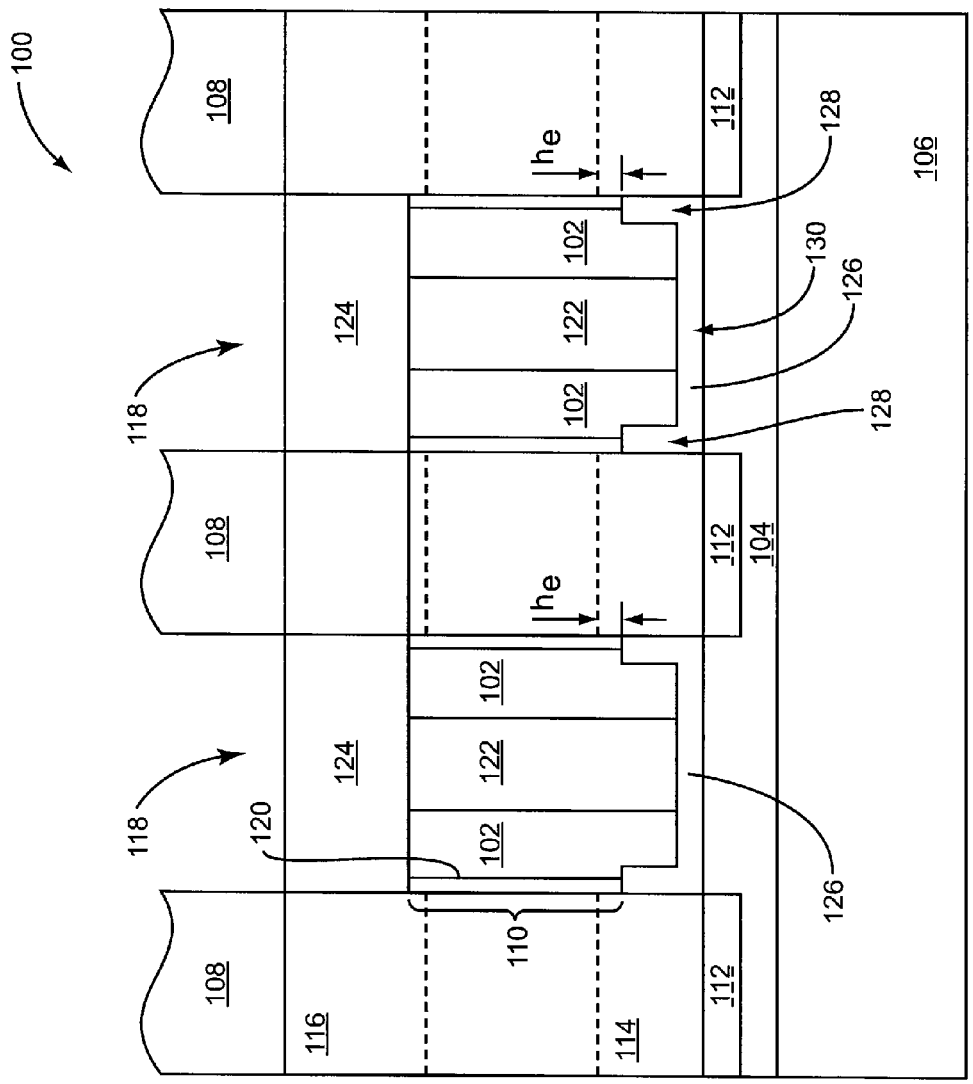
FIG. 1 is a cross-sectional view of an embodiment of a memory cell having a generally U-shaped insulating spacer for vertically separating a gate electrode from a buried interconnect line.

FIG. 1 illustrates an embodiment of a memory cell 100 including buried word and bit lines 102, 104 coupled to a vertical access transistor arranged in a semiconductor substrate 106. The word and bit lines 102, 104 are buried in that they are recessed into the substrate 106. The memory cell 100 may be any type of memory cell employing buried word and bit lines 102, 104 such as a DRAM cell, embedded-DRAM cell, MRAM cell, FLASH cell, etc. For ease of illustration only, the memory cell 100 is described herein as a DRAM memory cell. However, those skilled in the art will recognize that the embodiments disclosed herein are readily applicable to other types of memory cells having buried word and bit lines 102, 104.

With this understanding, the memory cell access transistor is coupled to an overlying storage element 108. The access transistor controls read/write access to the storage element 108. Particularly, the state of the buried word line 102 determines when the access transistor is activated by forming a channel region 110. Data is either written to or read from the storage element 108 via the bit line 104 arranged in the substrate 106 below the word line 102. The bit line 104 has a contact region 112 coupled to a first junction region 114 (e.g., source or drain region) of the access transistor. The access transistor has a second junction region 116 directly or indirectly coupled to the storage element 108. The junction regions 114, 116 of the access transistor are separated by the channel region 110 and can overlap with the channel region 110 as indicated by the dashed lines in FIG. 1. Charge flows between the buried bit line 104 and the storage capacitor 108 via the channel region 110 when the word line 102 is at a voltage level sufficient to form the channel region 110.

The word line 102 is arranged above the bit line 104 and bit line contact region 112 in a trench 118 formed in the semiconductor substrate 108. The word line 102 is separated from the channel region 110 of the access transistor by a thin gate insulator 120. An insulating region 122 separates adjacent word lines 102 arranged in the same trench 118. The insulating region 122 is not provided when a single word line 102 is disposed in the trench 118. A top insulating layer 124 may also be formed over the word line 102.

The word line 102 is also vertically separated from the underlying bit line 104 and bit line contact region 112 by a generally U-shaped insulating layer 126. The insulating layer 126 is generally U-shaped in that the layer 126 is thicker near opposing end regions 128 of the layer 126 than near an intermediate region 130. Broadly, the generally U-shaped insulating layer 126 can have any relatively U-shaped concave shape such as parabola or the like. In one embodiment, the opposing end regions 128 have a first generally uniform thickness ($t_e$) and the intermediate region 130 disposed between the opposing end regions 128 has a second generally uniform thickness ($t_i$) less than the first thickness. The different thicknesses $t_e$ and $t_i$ are generally uniform according to this embodiment in that they need not be exactly uniform across the entire width of the regions 128, 130, but instead may have some slight variation.

The generally U-shaped insulating layer 126 is arranged in a bottom region of the trench 118. As shown in the implementation of FIGS. 5-12, the generally U-shaped insulating layer 126 is not formed using a timed oxide etch recess process. Instead, the insulating layer 126 is formed by lining the trench 118 with an insulating material (not shown in FIG. 1) and selectively etching the material, for example using a doped sacrificial silicon layer (also not shown in FIG. 1) as a mask as will be described in more detail later. This way, the word line 102 and bit line 104 are vertically aligned. Also, the generally U-shaped insulating layer 126 can be made relatively thin according to the embodiments disclosed herein. Moreover, the thickness of the insulating layer 126 is better controlled and has less variability compared to conventional word line-to-bit line trench spacers. As such, the distance between the bit line contact region 112 and the vertical channel region 110 is less variable, improving overall memory cell performance. Broadly, the generally U-shaped insulating layer 126 can be employed in any integrated circuit having vertical transistors for separating gate electrodes such as the word line 102 from underlying buried interconnect lines such as the bit line 104/bit line contact region 112.

Several of the memory cells 100 can be interconnected as is known in the art to form a memory device. Broadly, the generally U-shaped insulating layer 126 can be employed in any type of integrated circuit having a first metal layer 104 recessed into a semiconductor substrate 106 and a second metal layer 102 arranged in a trench 118 formed in the substrate 106 above the first metal layer 104. The generally U-shaped insulating layer 126 can be arranged in a bottom region of the trench 118 for separating the second metal layer 104 from the first metal layer 102 and vertically aligning the first and second metal layers 104, 102.

Figure 2:
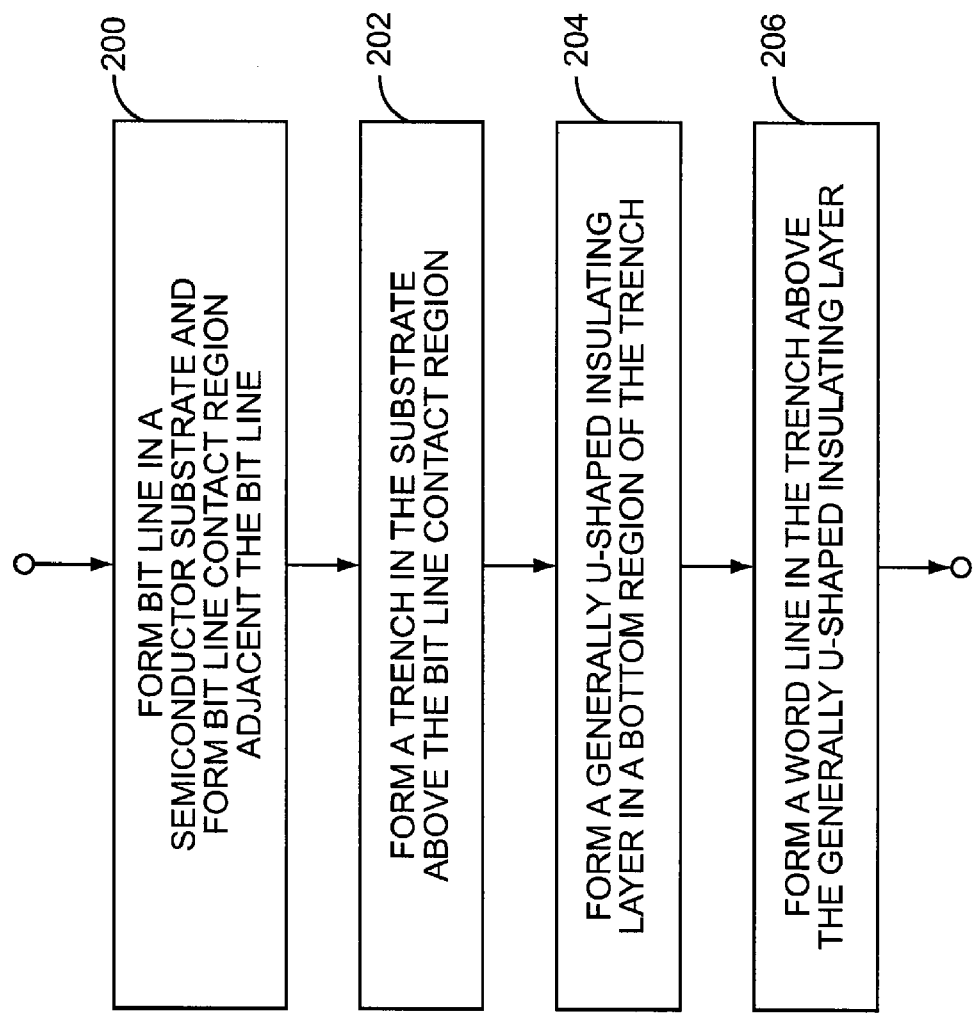
FIG. 2 is a diagram of an embodiment of a method for manufacturing the memory cell of FIG. 1.

FIG. 2 illustrates an embodiment of a method for manufacturing the memory cell 100. FIGS. 3-14 illustrate the semiconductor substrate 106 during different parts of the manufacturing embodiment of FIG. 2. The embodiment begins with forming the bit line 104 in the semiconductor substrate 106 and forming the bit line contact region 112 adjacent the bit line (Step 200). According to one embodiment, the bit line 104 is formed by etching a trench 118 in the substrate 106 and filling the trench 118 with a metal such as Tungsten. Alternatively, the bit line 104 may be formed by fabricating a poly-silicon region in the substrate 106.

Figure 4:
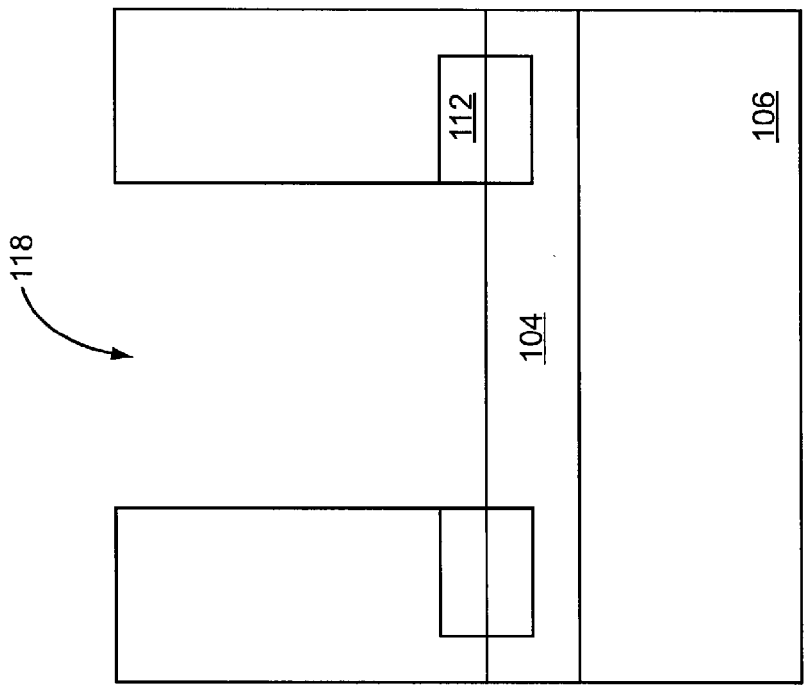
FIGS. 3-14 are cross-sectional views of an embodiment of a semiconductor substrate during different stages of the manufacturing embodiment illustrated in FIG. 2.
Figure 3:
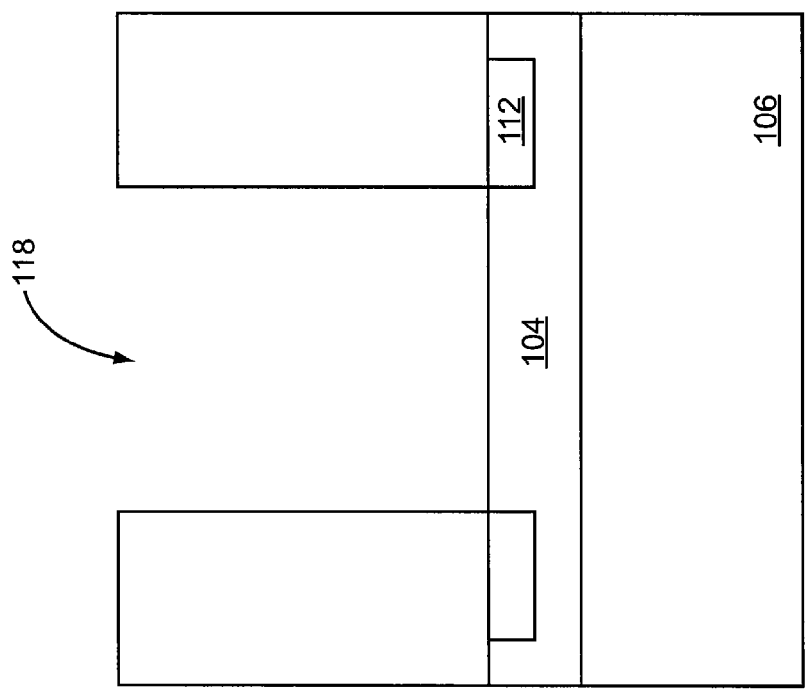

FIG. 3 illustrates an embodiment where the bit line contact region 112 is out-diffused from the buried bit line 104 into the adjacent region of the substrate 106. FIG. 4 illustrates another embodiment where the bit line contact region 112 is a poly-silicon region that extends from the bit line 104 upward into the substrate 106. In either embodiment, a trench 118 is then formed in the substrate 106 above the bit line contact region 112 (Step 202). According to one embodiment, the trench 118 is formed by etching a portion of the semiconductor substrate 106 until the underlying bit line 104 is exposed, e.g., until Tungsten is detected by a process sensor when the bit line 104 comprises Tungsten. In one embodiment, the trench 118 is approximately 200 nm deep and 40 nm wide. The generally U-shaped insulating layer 126 is then formed in a bottom region of the trench 118 (Step 204).

Figure 5:
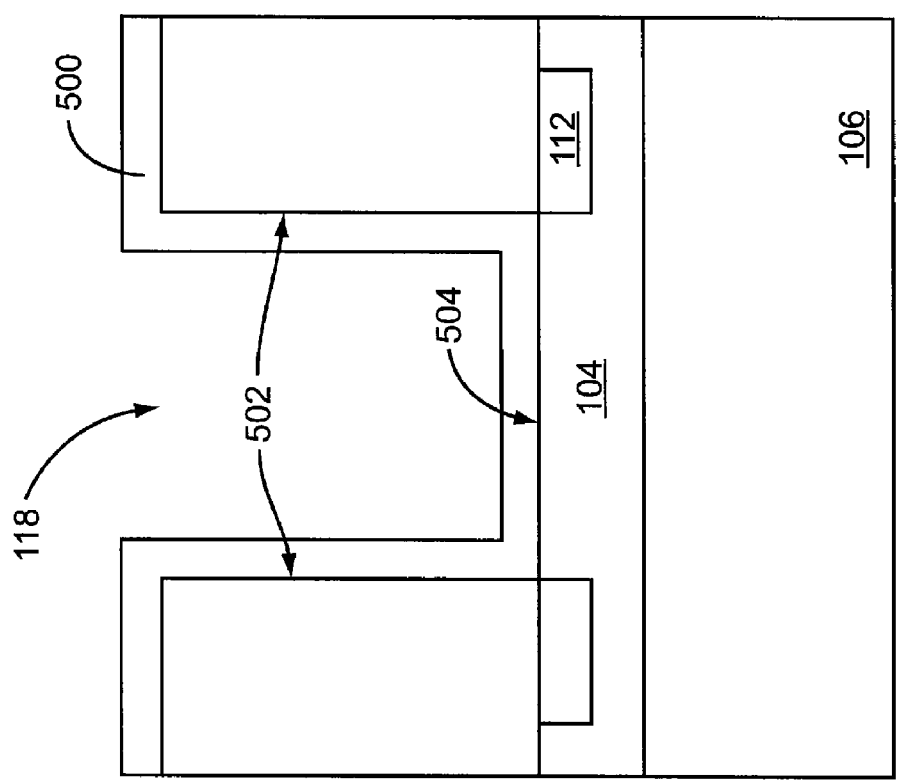
Figure 6:
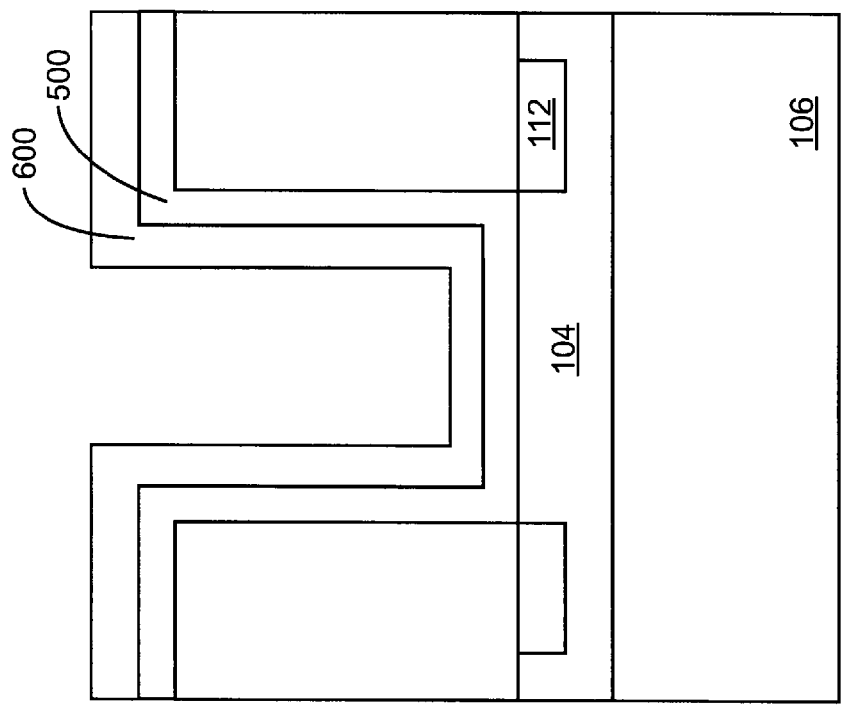
Figure 15:
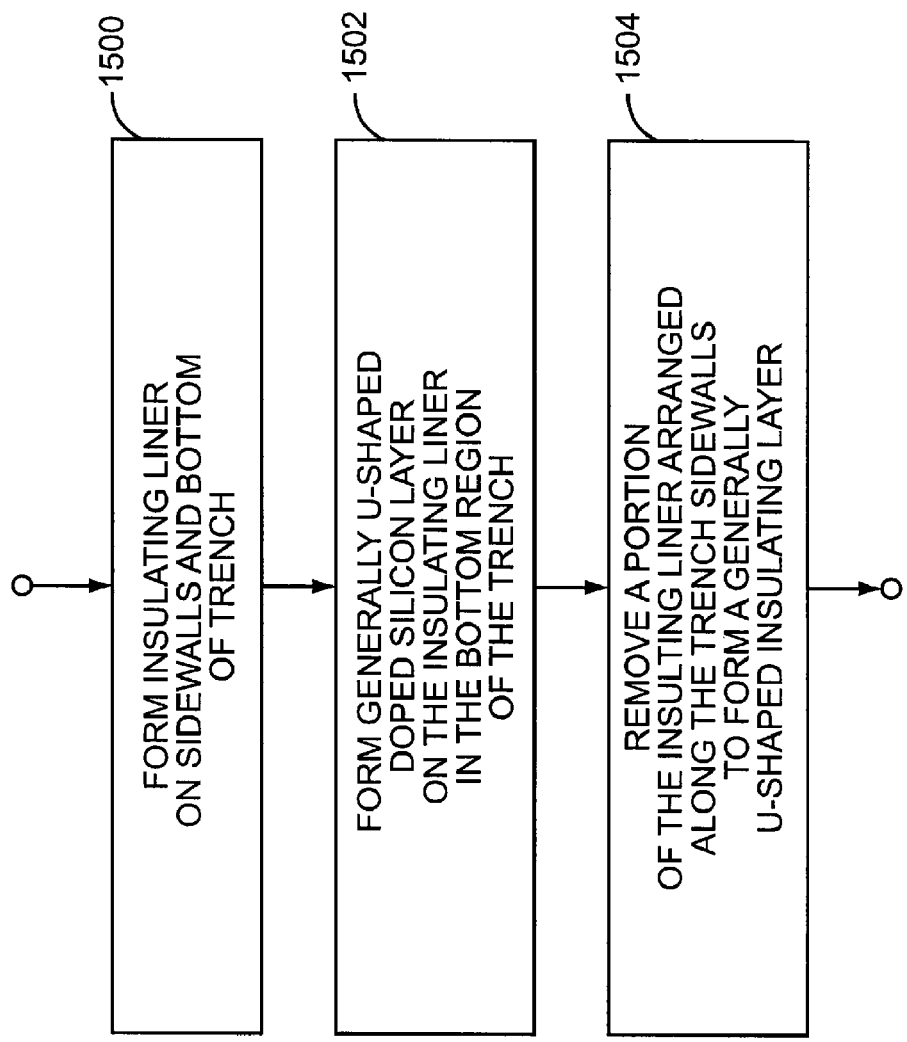
FIG. 15 is a diagram of an embodiment of a method for forming a generally U-shaped insulating spacer.

FIGS. 5-12 illustrate an embodiment for forming the generally U-shaped insulating layer 126 in the bottom of the trench 118. An insulating liner 500 is first formed on the sidewalls 502 and bottom 504 of the trench 118 as illustrated in FIG. 5 (Step 1500 in FIG. 15). In an embodiment, the insulating liner 500 is a conformal oxide liner deposited on the trench sidewalls 502 and bottom 504 using CVD (chemical vapor deposition). In another embodiment, the insulating liner 500 is a conformal nitride liner deposited using CVD. In one embodiment, the insulating liner 500 is approximately 5 to 40 nm thick. The density of the insulating liner 500 may be increased after deposition to increase the robustness of the liner 500 during subsequent etching. A crystalline, amorphous or poly-silicon liner 600 is then formed on the insulating liner 500 as illustrated in FIG. 6. In one embodiment, the silicon-based liner 600 is formed using CVD and is approximately 6 to 10 nm thick.

Figure 7:
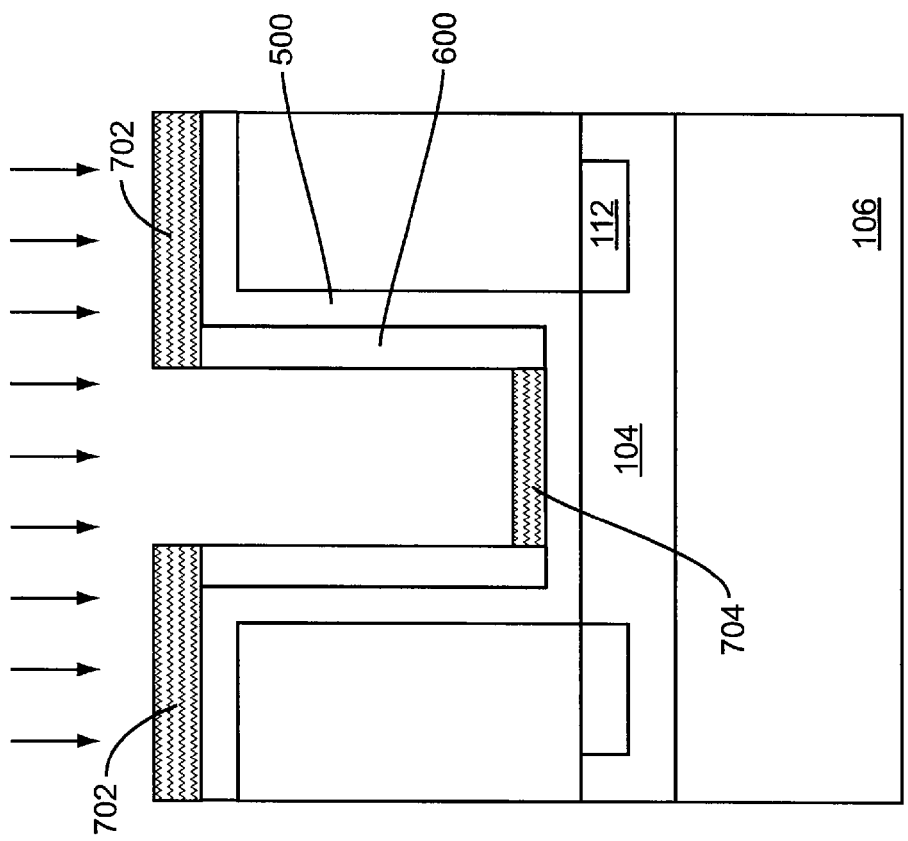
Figure 8:
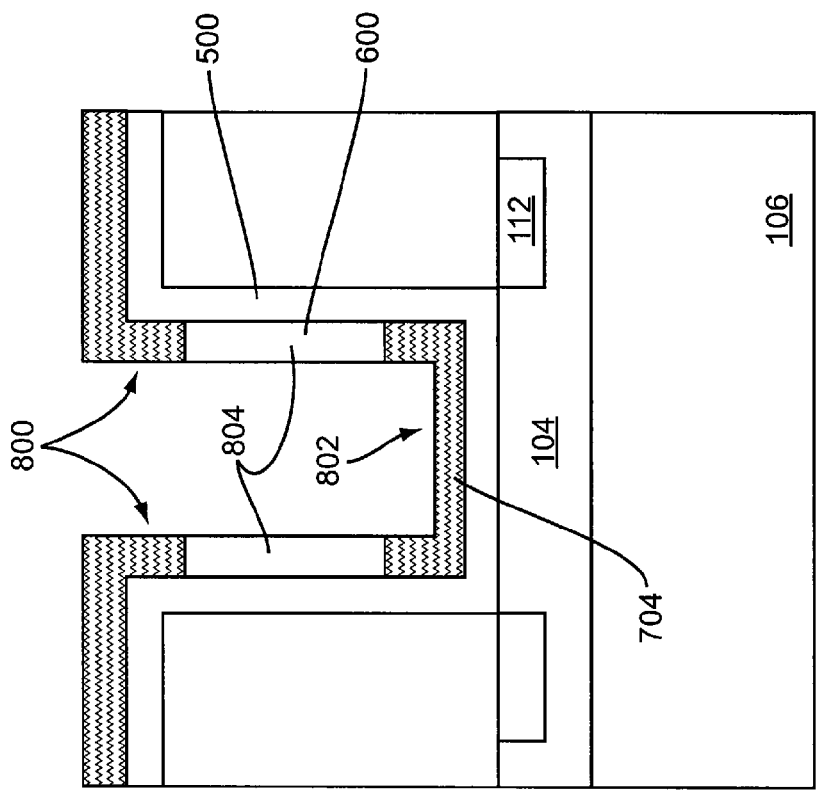

Dopants are implanted into upper and lower planar regions 700, 702 of the silicon-based liner 600 as illustrated by the arrows in FIG. 7. In one embodiment, the dopants are implanted at a 0° angle and the implant angle is slightly varied so that dopants can penetrate the liner 600 at the bottom trench corners. Some of the implanted dopants are then out-diffused into regions of the liner 600 adjoining the upper and lower planar regions 702, 704 as shown in FIG. 8. In one embodiment, the substrate 106 is sufficiently heated to out-diffuse the dopants between approximately 5 to 50 um. In one embodiment, the substrate 106 is heated for approximately 2 seconds at approximately 1000° C. In another embodiment, the substrate 106 is heated at approximately 950° C. for approximately 2 seconds. In yet another embodiment, the substrate 106 is subjected to rapid thermal processing for about 3 seconds at approximately 1000° C. Broadly, out-diffusing the dopants yields upper and lower doped regions 800, 802 of the silicon-based liner 600 and an un-doped intermediate region 804 as shown in FIG. 8.

Figure 9:
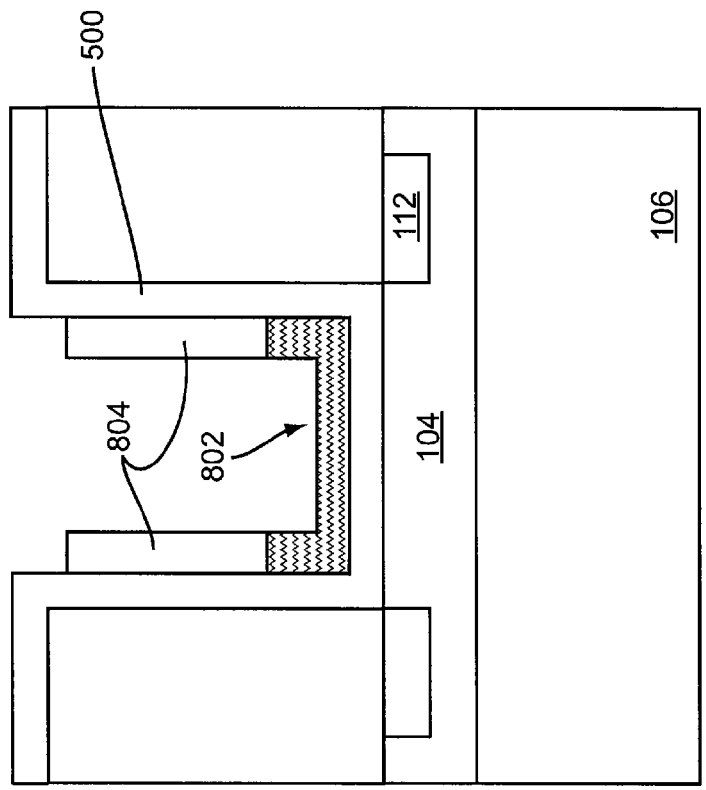
Figure 10:
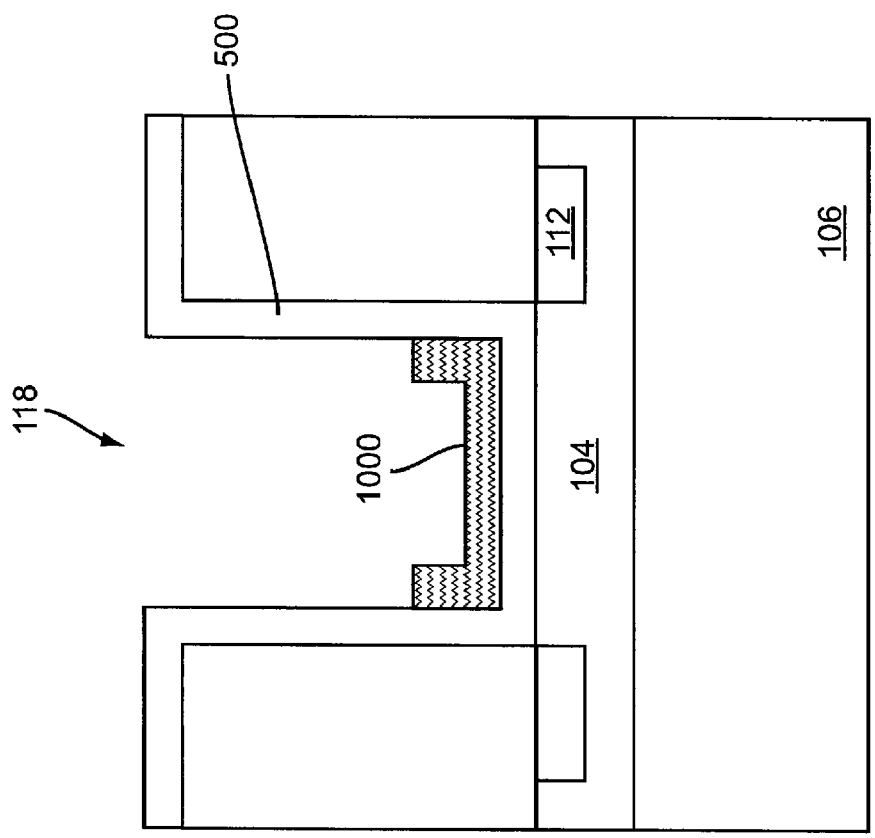

FIG. 9 shows the semiconductor substrate 106 after the upper doped region 800 of the silicon-based liner 600 is removed. The liner 600 may be crystalline, amorphous or poly-silicon depending on what material is originally deposited on the insulating liner 500 and at what temperature annealing was performed after formation of the silicon-based liner 600. In one embodiment, the upper doped region 800 is removed by depositing an antireflective coating (ARC), patterning the ARC over the upper doped region 800 of the liner 600 and etching the exposed region of the liner 600. In some embodiments, the upper doped region 800 is left intact. In either embodiment, the un-doped intermediate region 804 of the liner 600 is removed, resulting in a generally U-shaped doped silicon-based layer 1000 (crystalline, amorphous or poly-silicon) disposed over the insulating liner 500 in the bottom part of the trench 118 as illustrated in FIG. 10 (Step 1502 in FIG. 15). In one embodiment, the un-doped intermediate region 804 of the liner 600 is removed using KOH or $NH_4OH$.

Figure 11:
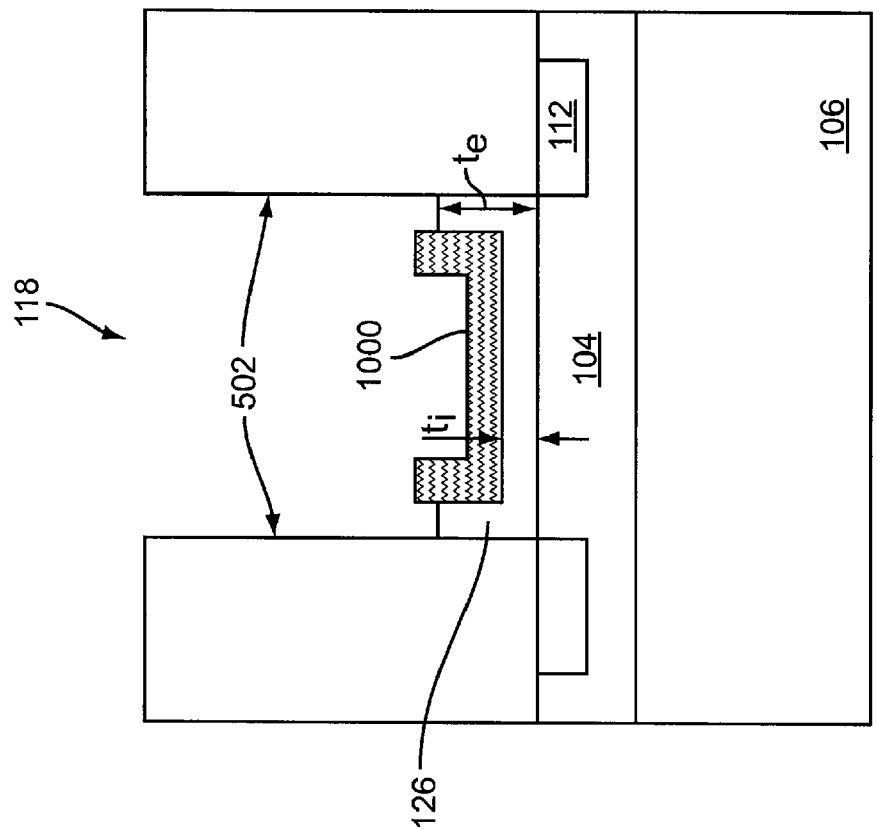

The remaining doped silicon-based layer 1000 disposed in the trench bottom is used as a mask to etch the insulating liner 500. Particularly, the exposed portion of the insulating liner 500 arranged along the trench sidewalls 502 is removed to form the generally U-shaped insulating layer 126 as shown in FIG. 11 (Step 1504 in FIG. 15). In one embodiment, all of the insulating liner 500 disposed along the trench sidewalls 502 above the doped silicon-based layer 1000 is removed. In addition, approximately 7 to 10 nm of the insulating liner 500 disposed along the trench sidewalls 502 below the doped layer 1000 is also removed, leaving the generally U-shaped insulating layer 126. The insulating liner 500 may be removed using HF when the liner 500 is an oxide or $H_3PO_4$ when the liner 500 is a nitride. Alternatively, the insulating liner 500 may be removed via an isotropic dry removal process.

In one embodiment, the insulating liner 500 is etched until the liner 500 has a vertical thickness ($t_e$) of approximately 10 nm to 100 nm along the trench sidewalls 502. In another embodiment, the insulating liner 500 is etched until $t_e$ is approximately ⅓ or less of the trench width. In each of these embodiments, the doped silicon-based layer 1000 disposed in the trench bottom protects the bottom portion of the insulating liner 500 while the sidewall portion of the liner 500 is etched to a desired thickness.

Figure 12:
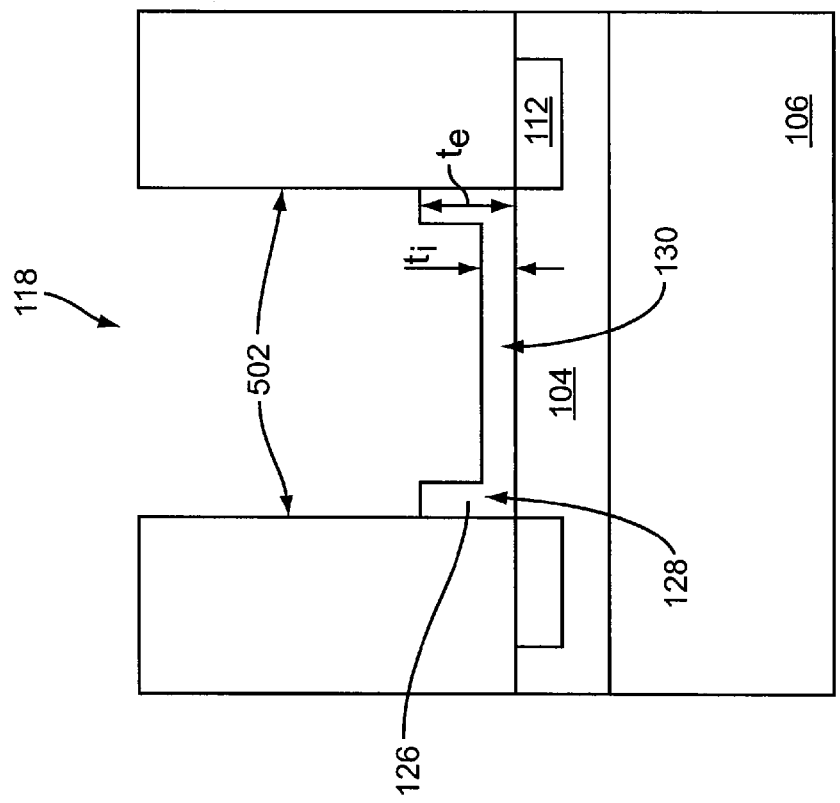

The doped silicon-based layer 1000 can be optionally removed after the generally U-shaped insulating layer 126 is formed as shown in FIG. 12. Alternatively, the doped layer 1000 can remain, where it becomes re-absorbed into the surrounding semiconductor substrate 106 during subsequent high-temperature processing. In either embodiment, the generally U-shaped insulating layer 126 has opposing end regions 128 of a first generally uniform thickness ($t_e$) and an intermediate region 130 disposed between the opposing end regions 128 of a second generally uniform thickness ($t_i$) substantially less than the first generally uniform thickness. In some embodiments, $t_e$ is between approximately 10 nm to 100 nm and $t_i$ is between approximately 5 nm to 40 nm. In one embodiment, $t_e$ is between approximately 20 nm to 30 nm and $t_i$ is between approximately 10 nm to 20 nm.

The thickness ($t_i$) of the intermediate region 130 of the generally U-shaped insulating layer 126 is determined by the deposition process used to form the insulating liner 500 because the intermediate region 130 is protected during etching by the overlying doped silicon-based layer 1000. Thin film deposition processes such as CVD are highly controllable and yield a relatively thin trench liner 500 having a very small thickness variation. The thickness ($t_e$) of the end regions 128 of the generally U-shaped insulating layer 126 is determined by the dopant implantation and out-diffusion processes in conjunction with the liner etch process. Only the sidewall regions of the insulating liner 500 are etched according to the embodiments disclosed herein, resulting in less etch variation. Moreover, the height of the overlying doped silicon-based layer 1000 can be precisely controlled during the dopant implantation and out-diffusion processes. As such, the generally U-shaped insulating layer 126 is thinner and has less etch-induced thickness variation compared to a conventional buried word line-to-bit line spacer.

Figure 13:
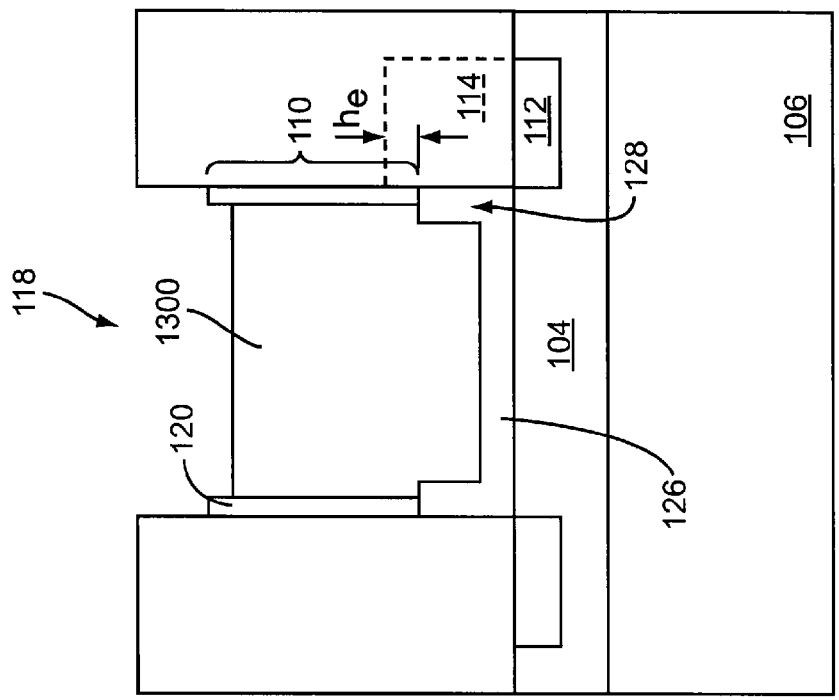

As such, the distance between the bit line contact region 112 and the vertical channel region 110 also has less variation, improving memory cell performance. Moreover, the processes used to form the generally U-shaped insulating layer 126 enable vertical alignment of the bit line 104 and the bit line contact region 112 to the word line 102. This improves transistor characteristics such as drain current, gate induced drain leakage, etc. In addition, the junction region 114 overlaps with the channel region 110 by a height ($h_e$) controlled by the thickness ($t_e$) of the opposing end regions 128 of the generally U-shaped insulating layer 126 and the out-diffusion process employed to form the junction region 114 as shown in FIG. 13.

Figure 14:
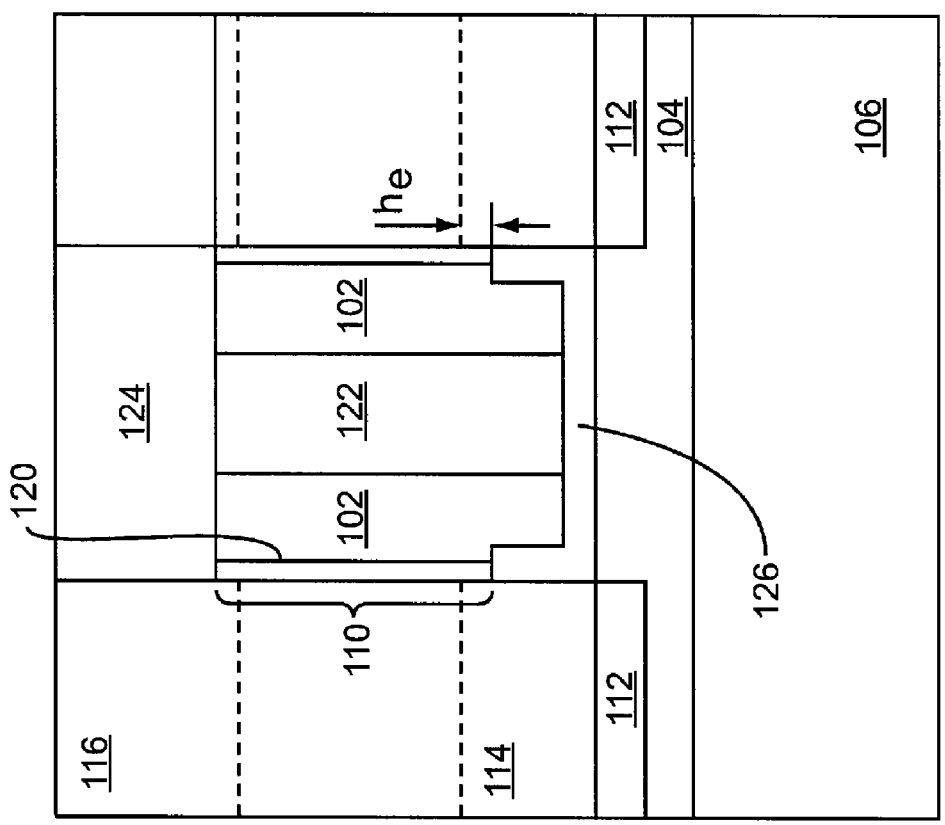

Processing of the memory cell 100 continues in FIG. 2 with the trench 118 being filled with metal 1300 to form the word line 102 (Step 206). In more detail, the gate insulator 120 is formed along the trench sidewalls 502 above the generally U-shaped insulating layer 126. The metal 1300 such as Tungsten with a TiN liner fills the remaining opening in the trench 118. The metal 1300 (and optionally the gate insulator 120) is then recessed as shown in FIG. 13. FIG. 14 also shows the substrate 106 after word lines 102 are formed in the trench 118 by etching a center region of the metal 1300 and filling the resulting void with an oxide or nitride layer 122 to isolate the adjacent word lines 102. The top insulating layer 124 is then formed over the word lines 102 and the substrate 106 is planarized, e.g., via a chemical-mechanical polishing process.

The storage element 108 is formed above the underlying bit line 104 and word line 102, which may be perpendicular to each other in some embodiments. The storage element 108 can be formed on the substrate surface or in one or more metal layers formed above the substrate 106 (not shown). The storage element 108 may be a DRAM capacitor, an MRAM magnetic storage element, a FLASH floating-gate, etc. depending on the type of memory cell 100 employed. The storage element 108 is omitted for other types of integrated circuits that employ the generally U-shaped insulating layer 126 for separating the gate electrode of a vertical transistor from the underlying buried interconnect line.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated circuit with a memory cell, comprising:
a bit line arranged in a semiconductor substrate;
a bit line contact region arranged adjacent the bit line;
a word line arranged above the bit line contact region in a trench formed in the semiconductor substrate; and
a generally U-shaped insulating layer arranged in a bottom region of the trench that separates the bit line and the bit line contact region from the word line,
wherein the generally U-shaped insulating layer comprises opposing end regions of a first generally uniform thickness and an intermediate region disposed between the opposing end regions of a second generally uniform thickness less than the first generally uniform thickness.

2. The integrated circuit of claim 1, wherein the bit line contact region comprises an out-diffusion region or a polysilicon region.

3. The integrated circuit of claim 1, wherein an out-diffusion region of the memory cell extends upward from the bit line contact region into a channel region of the memory cell by a distance determined by the thickness of an end region of the generally U-shaped insulating layer.

4. The integrated circuit of claim 1, wherein the first generally uniform thickness is between approximately 10 nm to 100 nm and the second generally uniform thickness is between approximately 5 nm to 40 nm.

5. The integrated circuit of claim 1, wherein the first generally uniform thickness is approximately ⅓ or less of a width of the trench.

6. The integrated circuit of claim 1, wherein the generally U-shaped insulating layer vertically aligns the bit line to the word line.

7. The integrated circuit of claim 1, wherein the bit line and the word line extend perpendicular to one another.

8. A memory device comprising a plurality of interconnected memory cells, each of the memory cells comprising:
    a bit line arranged in a semiconductor substrate;
    a bit line contact region arranged adjacent the bit line;
    a word line arranged above the bit line contact region in a trench formed in the semiconductor substrate; and
    a generally U-shaped insulating layer arranged in a bottom region of the trench that separates the bit line and the bit line contact region from the word line,
    wherein each generally U-shaped insulating layer comprises opposing end regions of a first generally uniform thickness and an intermediate region disposed between the opposing end regions of a second generally uniform thickness substantially less than the first generally uniform thickness.

9. The memory device of claim 8, wherein an out-diffusion region of each memory cell extends upward from the bit line contact region into a channel region of the memory cell by a distance determined by the thickness of an end region of the generally U-shaped insulating layer.

10. The memory device of claim 8, wherein the first generally uniform thickness is between approximately 10 nm to 100 nm and the second generally uniform thickness is between approximately 5 nm to 40 nm.

11. The memory device of claim 8, wherein the first generally uniform thickness is approximately ⅓ or less of a width of the trenches.

12. The memory device of claim 8, wherein the bit lines and the word lines extend perpendicular to one another.

13. An integrated circuit, comprising:
    a vertical transistor formed in a semiconductor substrate, the vertical transistor comprising a channel region arranged between lower and upper junction regions;
    a buried interconnect line arranged below the vertical transistor;
    a gate electrode disposed above the bit line contact in a trench arranged adjacent the channel region; and
    a generally U-shaped insulating layer arranged in a bottom region of the trench that separates the buried interconnect line from the gate electrode,
    wherein the lower junction region extends upward from the buried interconnect line into the channel region by a distance determined by the thickness of an end region of the generally U-shaped insulating layer.

* * * * *